United States Patent
Kim et al.

(10) Patent No.: US 8,456,907 B2
(45) Date of Patent: Jun. 4, 2013

(54) SEMICONDUCTOR MEMORY DEVICE AND METHOD OF OPERATING THE SAME

(75) Inventors: Ji Hwan Kim, Seoul (KR); Seong Je Park, Suwon-si (KR); Jung Hwan Lee, Suwon-si (KR); Myung Cho, Icheon-si (KR); Beom Seok Hah, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/337,196

(22) Filed: Dec. 26, 2011

(65) Prior Publication Data
US 2012/0170366 A1    Jul. 5, 2012

(30) Foreign Application Priority Data
Dec. 30, 2010    (KR) .................. 10-2010-0139170

(51) Int. Cl.
*G11C 11/34*    (2006.01)
(52) U.S. Cl.
USPC .......... 365/185.03; 365/189.011; 365/189.15; 365/189.16; 365/189.05; 365/189.07; 365/189.09
(58) Field of Classification Search
USPC .......... 365/185.03, 189.011, 189.15, 189.16, 365/189.05, 189.07, 189.09
See application file for complete search history.

(56) References Cited

U.S. PATENT DOCUMENTS

| | | | | |
|---|---|---|---|---|
| 7,751,253 B2* | 7/2010 | Sarin et al. | ............... | 365/185.22 |
| 7,885,119 B2* | 2/2011 | Li | .................. | 365/185.22 |

FOREIGN PATENT DOCUMENTS

KR    1020090102262 A    9/2009

* cited by examiner

*Primary Examiner* — Fernando Hidalgo
(74) *Attorney, Agent, or Firm* — William Park & Associates Patent Ltd.

(57) ABSTRACT

A method of operating a semiconductor memory device includes performing a first program loop including a first program operation and a first verification operation in order to store a lower bit data of n-bit data in memory cells coupled to a page, performing a subprogram loop for memory cells of an erase state, having threshold voltages lower than a target voltage of a negative potential, so that the threshold voltages of the memory cells of the erase state become higher than the target voltage, and performing a second program loop including a second program operation and a second verification operation in order to store an upper bit data of the n-bit data in the memory cells.

22 Claims, 6 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0139170 filed on Dec. 30, 2010, the entire disclosure of which is incorporated by reference herein, is claimed.

BACKGROUND

Exemplary embodiments relate generally to a semiconductor memory device and a method of operating the same and, more particularly, to a semiconductor memory device including nonvolatile memory cells and a method of operating the same.

In order to increase the data storage capacity, the multi-level cell technology, using multiple threshold voltage levels per cell to allow more bits to be stored, is being developed.

If n-bit data is stored in one memory cell, the threshold voltages of the memory cells are distributed in $2^n$ levels. In addition, the data stored in the memory cells is deleted by an erase operation. The threshold voltages of the memory cells on which the erase operation has been performed are distributed at the lowest level, and they typically have a value lower than 0 V.

That is, the threshold voltages of the memory cells are lowered up to the lowest level through the erase operation. Since the threshold voltages distributed in different levels are lowered to a low level, the threshold voltages of the memory cells on which the erase operation has been performed have a wide distribution. If the threshold voltage distribution is wide in an erase state, the characteristic of a program operation may be degraded.

For example, if memory cells having the lowest threshold voltage in a threshold voltage distribution of an erase state are programmed up to the highest threshold voltage in a program state distribution, interference to surrounding memory cells may increase, and thus a shift in the threshold voltages of the surrounding memory cells may occur.

BRIEF SUMMARY

According to exemplary embodiments, the width of a threshold voltage distribution of memory cell s having an erase state become narrow by raising the threshold voltages. Accordingly, a program operation characteristic can be improved because a program interference phenomenon occurring when the memory cells are programmed is reduced.

A method of operating a semiconductor memory device according to an aspect of the present disclosure includes performing a LSB program loop using a first program voltage and a first verification voltage in order to store the LSB data of 3-bit data in memory cells coupled to a page, performing a subprogram loop for memory cells of an erase state, having threshold voltages lower than a target voltage of a negative potential, from among the memory cells of the page, so that the threshold voltages of the memory cells of the erase state become higher than the target voltage, performing a CSB program loop using a second program voltage and a second verification voltage in order to store the CSB data of the 3-bit data in the memory cells of the page, and an MSB program operation using a third program voltage and a third verification voltage in order to store MSB data of the 3-bit data in the memory cells of the page A method of operating a semiconductor memory device according to another aspect of the present disclosure includes performing a LSB program loop using a first program voltage and a first verification voltage in order to store the LSB data of 2-bit data in memory cells coupled to a page, performing a subprogram loop for memory cells of an erase state, having threshold voltages lower than a target voltage of a negative potential, from among the memory cells of the page, so that the threshold voltages of the memory cells of the erase state become higher than the target voltage, and an MSB program operation using a second program voltage and a second verification voltage in order to store MSB data of the 2-bit data in the memory cells of the page A semiconductor memory device according to yet another aspect of the present disclosure includes a memory cell array configured to include memory cells included in each of a plurality of pages, an operation circuit group configured to perform an LSB program loop, a CSB program loop, an MSB program loop, and a subprogram loop for the memory cells belonging to a page selected from the pages, and a controller configured to control the operation circuit group so that a subprogram loop for raising memory cells of an erase state, having threshold voltages lower than a target voltage of a negative potential, from among the memory cells of the selected page, higher than the target voltage is performed before the LSB program loop, the CSB program loop, or the MSB program loop is performed.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the exemplary embodiments of the disclosure.

Figure 1:
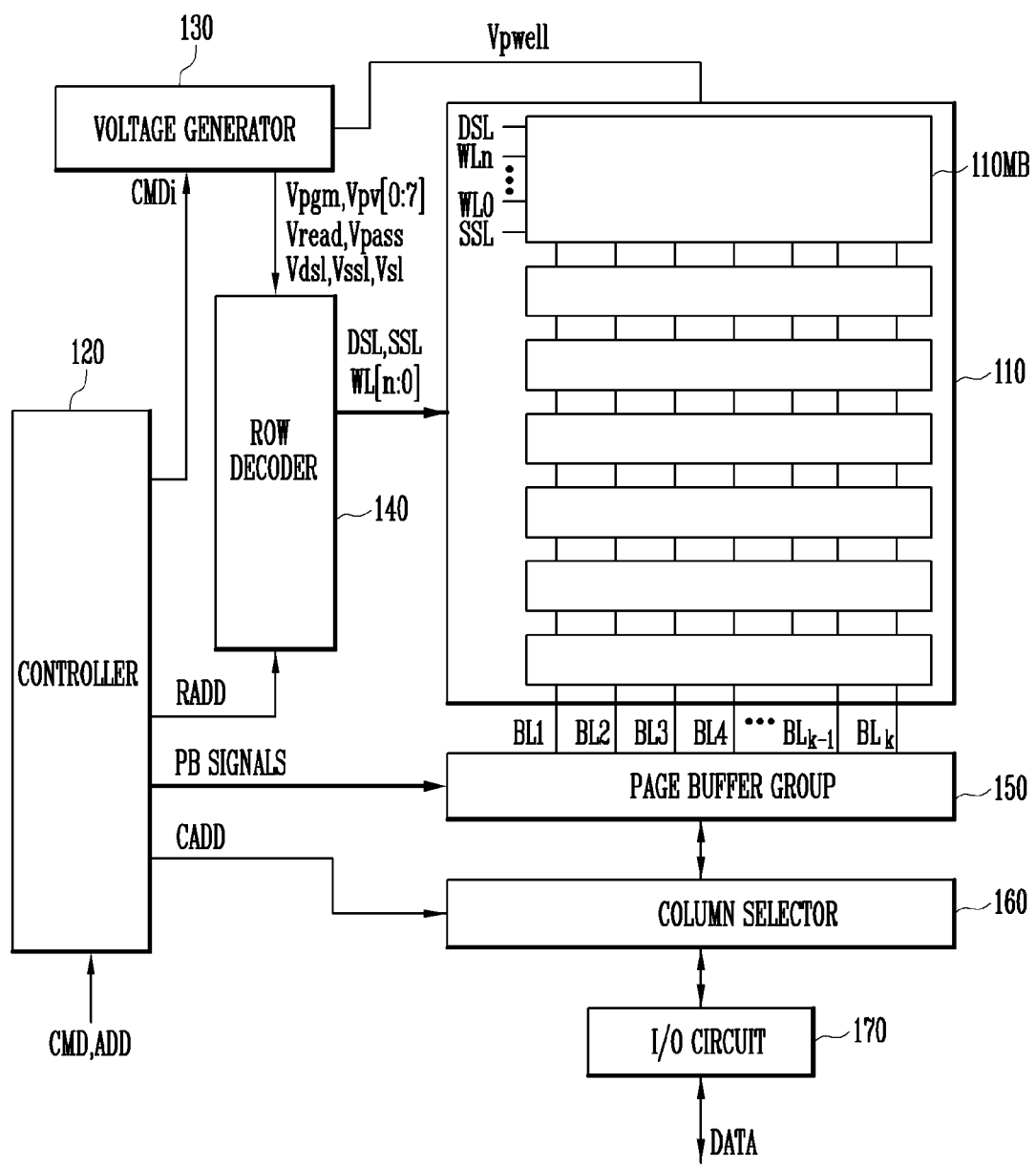
FIG. 1 is a circuit diagram of a semiconductor memory device according to an exemplary embodiment of this disclosure.
Figure 2:
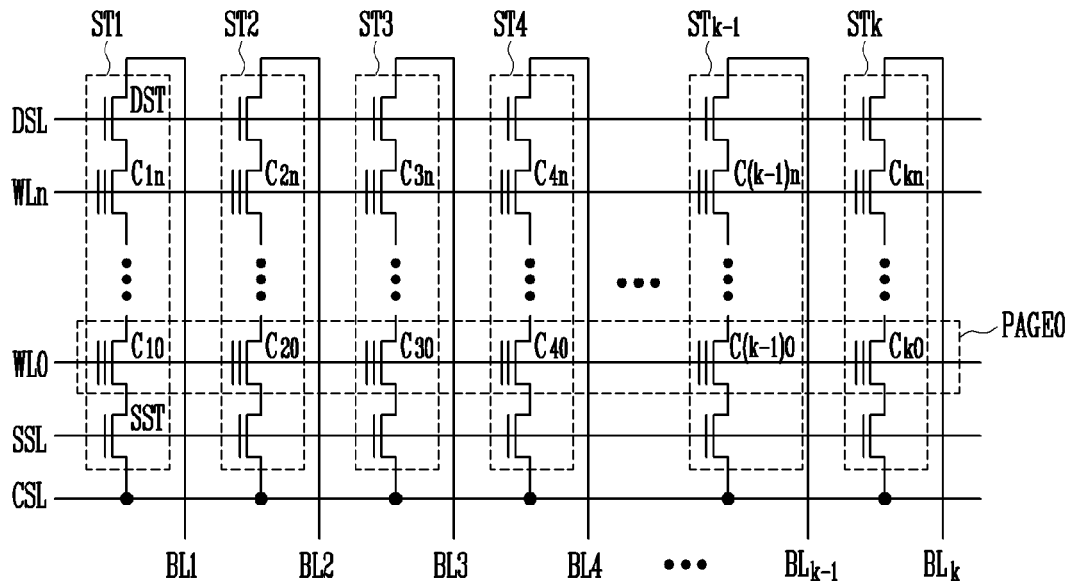
FIG. 2 is a circuit diagram of a memory block shown in FIG. 1.

FIG. 1 is a circuit diagram of a semiconductor memory device according to an exemplary embodiment of this disclosure, and FIG. 2 is a circuit diagram of a memory block shown in FIG. 1.

Referring to FIG. 1, the semiconductor memory device includes a memory cell array 110 configured to include a plurality of memory blocks 110MB, an operation circuit group (e.g., 130, 140, 150, 160, and 170) configured to perform the program operation, the read operation, or the erase operation of memory cells included in the memory blocks 110MB, and a controller 120 configured to control the operation circuit group (e.g., 130, 140, 150, 160, and 170). In the case of a NAND flash memory device, the operation circuit group includes a voltage supply circuit (e.g., 130 and 140), a page buffer group 150, a column selector 160, and an I/O circuit 170.

Each of the memory blocks 110MB of the memory cell array 110 includes a plurality of memory cell, and it is described in detail below.

Referring to FIG. 2, each of the memory blocks 110MB includes a plurality of strings ST1, ST2, ..., STk-1 and STk coupled between a common source line CSL and respective bit lines BL1 to BLk. That is, the strings ST1, ST2, ..., STk-1 and STk are coupled to the respective bit lines BL1, BL2, ..., BLk-1 and BLk and coupled in common to the common source line CSL. Each of the strings, e.g., a first string ST1 includes a source select transistor SST having a source coupled to the common source line CSL, a plurality of memory cells C10, C11, ..., C1(n-1) and C1n, and a drain select transistor DST having a drain coupled to the bit line BL1. The gate of the source select transistor SST is coupled to a source select line SSL. The gates of the memory cells C10, C11, ..., C1(n-1) and C1n are coupled to respective word lines WL0, WL1, ..., WLn-1 and WLn. The gate of the drain select transistor DST is coupled to a drain select line DSL.

In a NAND flash memory device, the memory device may include a number of blocks, and the block may include a number of pages. Here, the page may be classified into a physical page and a logical page. Further, reading and programming may be performed on the page basis, and the physical page may be divided into an even page and an odd page.

For example, the memory cells C10, C20, ..., C(k-1)0 and Ck0 coupled to a word line WL0 may form a physical page PAGE0. Furthermore, the even-numbered memory cells coupled to the word line WL0 may form an even physical page, and the odd-numbered memory cells coupled to the word line WL0 may form an odd physical page.

Referring back to FIG. 1, the controller 120 generates an internal command signal CMDi for a program operation, a read operation, or an erase operation in response to an external command signal CMD. The controller 120 generates control signals PB SIGNALS for controlling the page buffers (not shown) of the page buffer group 150 according to a type of the operation. Furthermore, the controller 120 generates a row address signal RADD and a column address signal CADD in response to an address signal ADD.

The voltage supply circuit (e.g., 130 and 140) supplies the drain select line DSL, the word lines WL0, WL1, ..., WLn-1 and WLn, and the source select line SSL of the memory block 110MB with operating voltages for the program operation, the erase operation, or the read operation of the memory cells in response to the internal command signal CMDi. Here, the voltage supply circuit may include the voltage generator 130 and the row decoder 140.

The voltage generator 130 outputs the operating voltages for the program operation or the read operation of the memory cells to global lines in response to the internal command signal CMDi. When the program operation or the read operation is performed, the voltage generator 130 generates a program voltage Vpgm, program verification voltages Vpv[0:7], or a read voltage Vread to be supplied to selected memory cells, generates a pass voltage Vpass to be supplied to unselected memory cells, and generates voltages Vdsl, Vssl, and Vsl to be supplied to select lines. In addition, the voltage generator 130 generates a bulk bias Vpwell to be supplied to a bulk (or P-well) on which the memory cells are formed. In a subprogram verification operation, the voltage generator 130 generates the bulk bias Vpwell of a positive potential.

The row decoder 140 transfers the operating voltages of the voltage generator 130 to the local lines DSL, WL0, WL1, ..., WLn-1 and WLn, and SSL of the memory block 110MB in response to the row address signals RADD.

The page buffer group 150 includes a plurality of the page buffers. The page buffers may be coupled to the respective bit lines BL1, BL2, ..., BLk-1 and BLk or may be coupled to a pair of bit lines, including an even bit line and an odd bit line. Each of the page buffers stores a certain data and controls the voltages of the bit lines BL1, BL2, ..., BLk-1 and BLk in order to read data from the memory cells C10, C20, ..., C(k-1)0 and Ck0 or program data into the memory cells C10, C20, ..., C(k-1)0 and Ck0, in response to the control signals PB SIGNALS of the controller 120.

The column selector 160 selects the page buffers of the page buffer group 150 in response to the column address signal CADD of the controller 120. The column selector 160 receives external data DATA to be stored in the memory cells coupled to the selected page buffers or outputs data DATA received from the memory cells coupled to the selected page buffers.

The I/O circuit 170 transfers the external data DATA to the column selector 160 under the control of the controller 120 during a program operation so that the data is inputted to the page buffer group 150. When the column selector 160 transfers the data to the page buffers of the page buffer group 150, the page buffers store the received data in their latches. Furthermore, when a read operation is performed, the I/O circuit 170 outputs data DATA received from the page buffers of the page buffer group 150 via the column selector 160.

In the semiconductor memory device configured as above, a program operation may be performed in order to store multi-bit data such as 2-bit data or 3-bit data in a memory cell. With an increase in the number of bits of data stored in the memory cell, the number of threshold voltage distributions of the memory cells increases. Therefore, a probability of an occurrence of an interference phenomenon may increase. For this reason, the width of each threshold voltage distribution must be narrow, and the interval between the threshold voltage distributions must be widened. Methods of operating the semiconductor memory device, which is capable of reducing the interference phenomenon are described below.

Figure 3:
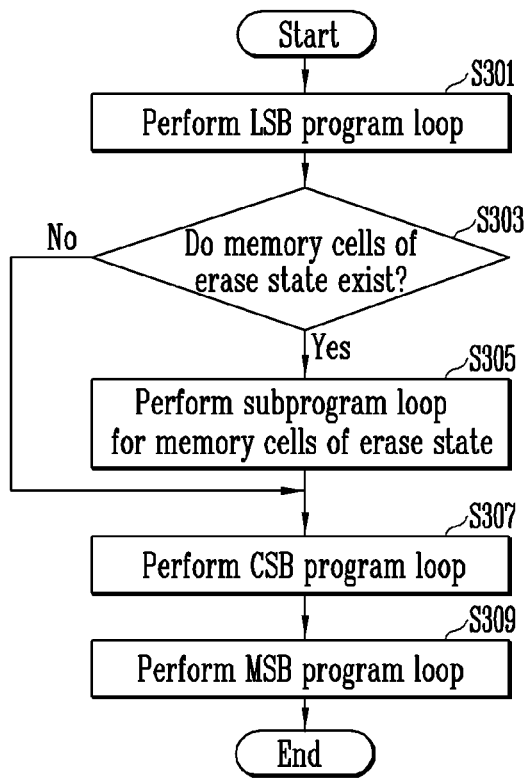
FIG. 3 is a flowchart illustrating a method of operating the semiconductor memory device according to an exemplary embodiment of this disclosure.

FIG. 3 is a flowchart illustrating a method of operating the semiconductor memory device according to an exemplary embodiment of this disclosure. FIGS. 4A to 4D show waveforms illustrating threshold voltages shifted according to the method of operating the semiconductor memory device according to an exemplary embodiment of this disclosure.

Referring to FIGS. 1, 2, 3, and 4A, at step S301, a least significant bit (hereinafter referred to as an 'LSB') program loop is performed in order to store the LSB data of n-bit data, e.g., 3-bit data in the memory cells of a selected page. The LSB program loop includes an LSB program operation and an LSB program verification operation. For the LSB program operation, the voltage supply circuit (e.g., 130 and 140) supplies the program voltage Vpgm to the memory cells. The page buffer group 150 supplies a program prohibition voltage (for example, a power supply voltage) to the bit lines coupled to the memory cells in which erase data (for example, '1') is to be stored as the LSB data and supplies a program permission voltage (for example, a ground voltage) to the bit lines of the memory cells in which program data (for example, '0') is to be stored as the LSB data.

Accordingly, the threshold voltage of the memory cells in which the erase data (for example, '1') of the lowers bits is to be stored as the LSB data is maintained to be lower than 0 V. Furthermore, the threshold voltage of the memory cells in which the program data (for example, '0') is to be stored as the LSB data is changed to be higher than 0 V, e.g., a first verification voltage Vpv1.

In addition, during the LSB program loop, after each of the application of the program voltage, the LSB program verification operation is performed. When some of the memory cells to be programmed have the threshold voltages lower than a target level in the LSB program verification operation, the program voltage is raised and the LSB program operation is further performed by supplying the raised program voltage Vpgm to the memory cells. Next, the LSB program verification operation is performed again. The sequence of the program loop above may be applied to a central significant bit (hereinafter referred to as a 'CSB') program loop or a most significant bit (hereinafter referred to as an 'MSB') program loop.

After the LSB program loop is completed, the controller 120 determines whether there are memory cells remained in an erase state at step S303. The LSB data stored in the memory cells is remained in the page buffer group 150. Accordingly, the controller 120 can determine whether there are memory cells remained in the erase state by detecting the data of the page buffer group 150.

For example, if all the data of the page buffer group 150 are program data (for example, '0'), it may be determined that there is no memory cell remained in the erase state.

Referring to FIGS. 1, 2, 3, and 4B, if, as a result of the determination at step S303, the memory cells remained in the erase state are determined to exist, a subprogram loop is performed on the memory cells in the erase state at step S305 so that the threshold voltages of the memory cells, having threshold voltages lower than a target voltage Vpv0 of a negative potential, become higher than the target voltage Vpv0. The subprogram loop may include a subprogram operation and a subverification operation.

In order to detect the memory cells having the threshold voltages lower than the target voltage Vpv0, in the subverification operation, a verification voltage of a negative potential may be supplied to a word line coupled to the memory cells. In order to generate the verification voltage of a negative potential, however, the entire circuit area may increase because of a negative voltage generator. Therefore, the memory cells, having the threshold voltages lower than the target voltage Vpv0, may be detected using a positive voltage. The subverification operation for detecting the memory cells having the threshold voltages lower than the target voltage Vpv0 of a negative potential, using the positive voltage, is described in detail below.

Figure 5:
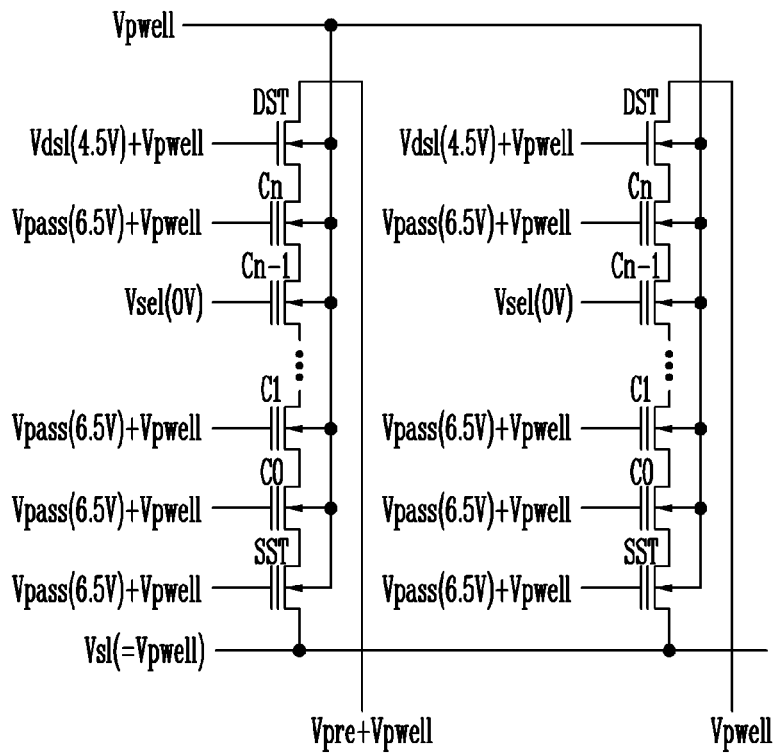
FIG. 5 is a circuit diagram for explaining a subprogram loop according to an exemplary embodiment of this disclosure.

FIG. 5 is a circuit diagram explaining a subprogram loop according to an exemplary embodiment of this disclosure.

Figure 4A:
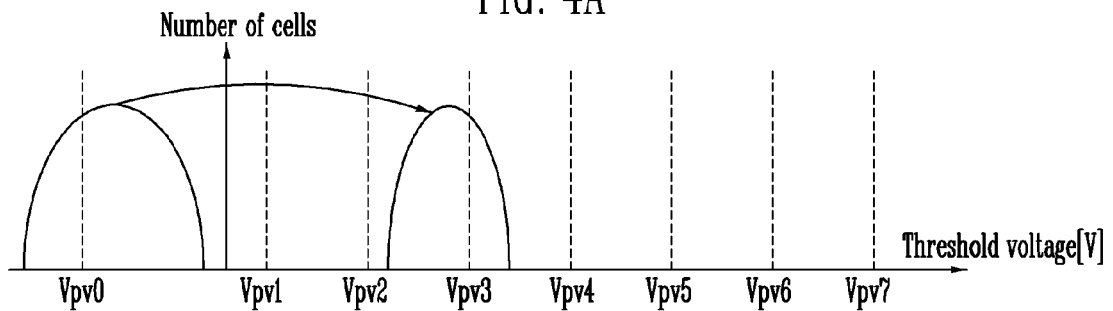
FIGS. 4A to 4D show waveforms illustrating threshold voltages shifted according to the method of operating the semiconductor memory device according to an exemplary embodiment of this disclosure.
Figure 4B:
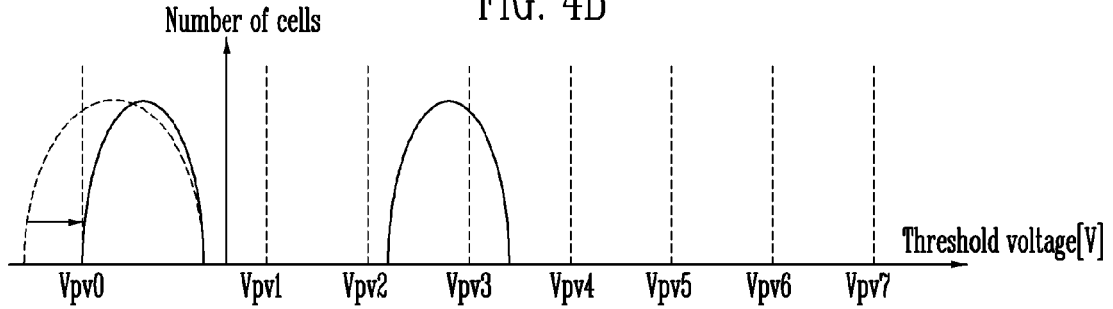
Figure 4C:
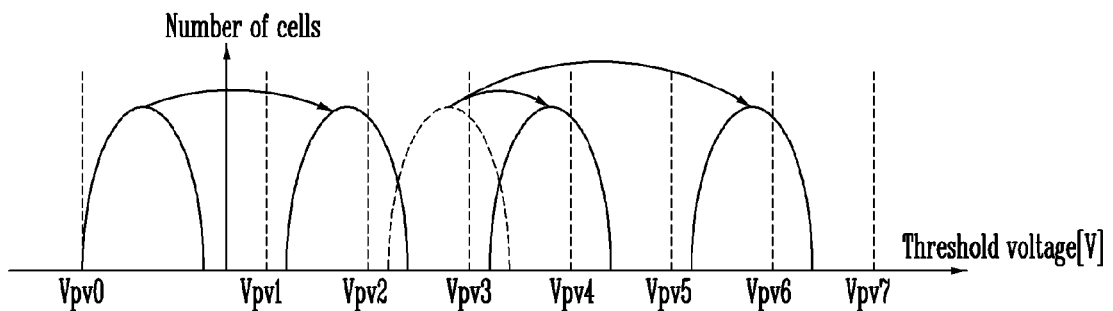
Figure 4D:
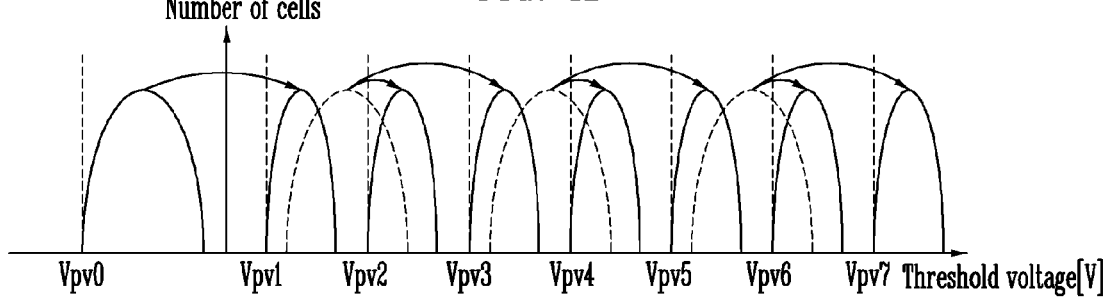

Referring to FIGS. 4B and 5, a ground voltage Vsel (for example, 0 V) is supplied to memory cells belonging to a selected page, and a positive voltage Vpwell is supplied to a bulk (for example, a P-well) on which the memory cells are formed. The positive voltage Vpwell supplied to the bulk may have a voltage level corresponding to an absolute value of the target voltage Vpv0 of a negative potential. Furthermore, when the positive voltage Vpwell is applied to the bulk, the voltages of the word lines coupled to memory cells belonging to unselected pages may become a pass voltage Vpass+Vpwell raised by the positive voltage Vpwell, and a precharge voltage of the bit lines may become a precharge voltage Vpre+Vpwell raised by the positive voltage Vpwell. In addition, each of voltages Vdsl+Vpwell, Vssl+Vpwell, and Vsl+Vpwell to select lines DSL and SSL and a source line SL are raised by the positive voltage Vpwell. Accordingly, a voltage difference between the bulk and the word line coupled to the memory cells of the selected page becomes equal to the target voltage Vpv0 of a negative potential. Consequently, the verification voltage corresponding to the target voltage Vpv0 may become a negative potential as if the target voltage Vpv0 of a negative potential is applied to the selected memory cells.

When the voltages are applied under the above conditions, the precharge voltage Vpre+Vpwell of the bit lines, coupled to the memory cells having the threshold voltages lower than the target voltage Vpv0 of a negative potential, may be discharged. However, the precharge voltage Vpre+Vpwell of the bit lines, coupled to the memory cells having the threshold voltages higher than the target voltage Vpv0 of a negative potential, is maintained. As described above, according to an example, the page buffer group 150 detects the memory cells, having the threshold voltages lower than the target voltage Vpv0 of a negative potential, by detecting a shift in the voltage of the bit line BL.

Next, the subprogram operation is performed so that the detected threshold voltages of the memory cells become higher than the target voltage Vpv0 of a negative potential. For the subprogram operation, the voltage supply circuit (e.g., 130 and 140) supplies the program voltage Vpgm to the memory cells of the selected page. Furthermore, the voltage supply circuit (e.g., 130 and 140) supplies the program prohibition voltage (for example, the power supply voltage) to the bit lines of the memory cells having the threshold voltages higher than the target voltage Vpv0 of a negative potential and supplies the program permission voltage (for example, the ground voltage) to the bit lines of the memory cells having the threshold voltages lower than the target voltage Vpv0 of a negative potential. Accordingly, the threshold voltages of the memory cells having the threshold voltages lower than the target voltage Vpv0 rise. The subprogram loop is repeatedly performed until all the threshold voltages of the memory cells become higher than the target voltage Vpv0.

If, as a result of the determination at step S303, the memory cells in the erase state are determined not to exist after the LSB program loop is completed, the subprogram loop may be omitted and a program loop for programming an upper bit, e.g., the CSB program loop of 3-bit multi-level programming may be performed.

Referring to back to FIGS. 1, 2, 3, and 4C, a program loop for programming an upper bit, e.g., the CSB program loop for storing the CSB data of the 3-bit data is performed at step S307. The CSB program loop includes a CSB program operation and a CSB program verification operation. For the CSB program operation, the voltage supply circuit (e.g., 130 and 140) supplies the program voltage Vpgm to the memory cells of the selected page. Furthermore, the page buffer group 150 supplies the program prohibition voltage (for example, the power supply voltage) to the bit lines of the memory cells in which erase data (for example, '1') is to be stored as the CSB data and supplies the program permission voltage (for example, the ground voltage) to the bit lines of the memory cells in which program data (for example, '0') is to be stored as the CSB data.

Accordingly, the threshold voltages of the memory cells have four different distributions according to a level of the LSB data stored through the LSB program loop and a level of the CSB data stored through the CSB program operation.

After the CSB program operation is performed, the CSB program verification operation is performed. When memory cells having threshold voltages lower than the target voltages, the program voltage Vpgm is raised, the CSB program operation is further performed by applying the raised program voltage Vpgm to the memory cells, and the CSB program verification operation is performed again.

Referring to FIGS. 1, 2, 3, and 4D, a program loop for programming an upper bit, e.g., an MSB program loop for storing the MSB data of the 3-bit data is performed at step S309. The MSB program loop includes an MSB program operation and an MSB program verification operation. For the MSB program operation, the voltage supply circuit (e.g., 130 and 140) supplies the program voltage Vpgm to the memory cells of the selected page. Furthermore, the page buffer group 150 supplies a program prohibition voltage (for example, a power supply voltage) to the bit lines of the memory cells in which erase data (for example, '1') is to be stored as the MSB data and supplies a program permission voltage (for example, a ground voltage) to the bit lines of the memory cells in which program data (for example, '0') is to be stored as the MSB data.

Accordingly, the threshold voltages of the memory cells have 8 different distributions according to the levels of the LSB data and the central bit, stored through the LSB program loop and the CSB program loop, and the level of the MSB data stored through the MSB program operation.

After the MSB program operation is performed, the MSB program verification operation is performed. In the MSB program verification operation, if memory cells having threshold voltages not reached each of target levels PV1 to PV7 are detected, the program voltage Vpgm is raised, and the MSB program operation is further performed by supplying the raised program voltage Vpgm to the memory cells. Next, the MSB program verification operation is performed again.

Accordingly, the entire program loop for storing the 3-bit data is completed.

Before the CSB program loop is performed, the subprogram loop may be performed so that the width of a threshold voltage distribution of the memory cells in the erase state become narrow. Accordingly, an increment of the threshold voltage may be reduced in the CSB program loop and the MSB program loop, and thus a program interference phenomenon occurring in the CSB program loop and the MSB program loop can be reduced.

In addition, before the LSB program loop is performed, the subprogram loop may be performed. Therefore, by performing the subprogram loop, the width of a threshold voltage distribution of the memory cells in the erase state become narrow. Accordingly, an increment of the threshold voltage can be reduced in the LSB program loop, and thus a program interference phenomenon occurring in the LSB program loop can be reduced.

Furthermore, after the CSB program loop is completed, the subprogram loop may be performed before the MSB program loop is performed. Therefore, by performing the subprogram loop, an increment of the threshold voltage can be reduced in the MSB program loop by narrowing the width of a threshold voltage distribution of the memory cells in the erase state. Accordingly, a program interference phenomenon occurring in the MSB program loop can be reduced.

In addition, the subprogram loop may also be applied to a 2-bit multi-level programming. Furthermore, the subprogram loop may be applied to n-bit multi-level programming. Here, the n-bit is 4-bit or more.

Figure 6:
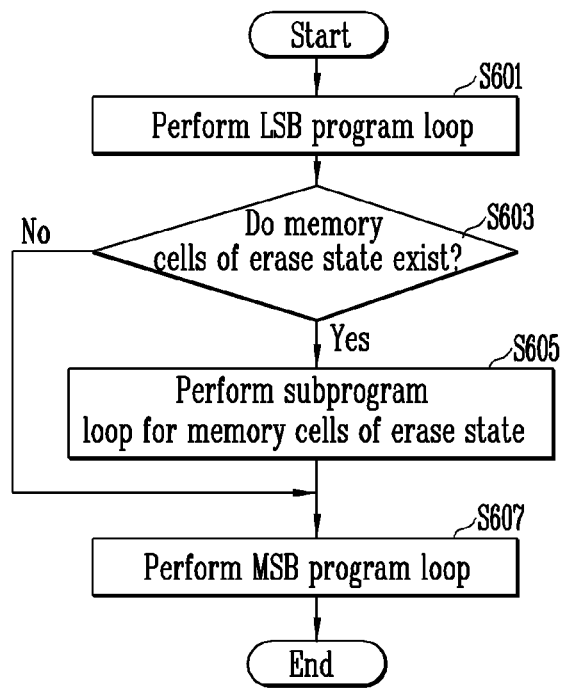
FIG. 6 is a flowchart illustrating a method of operating the semiconductor memory device according to an exemplary embodiment of this disclosure.
Figure 7A:
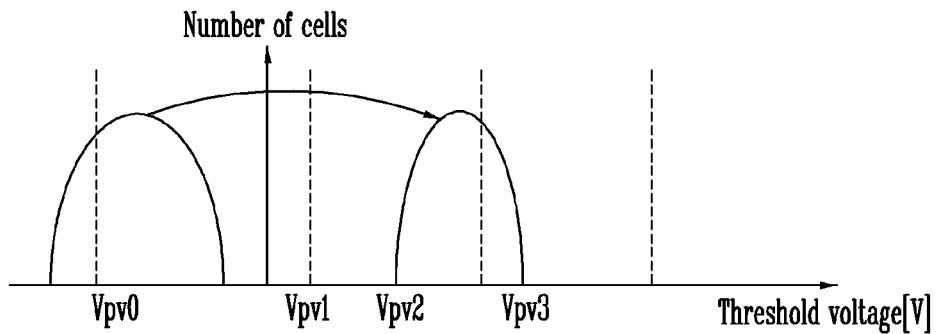
FIGS. 7A to 7C show waveforms illustrating threshold voltages shifted according to the method of operating the semiconductor memory device according to an exemplary embodiment of this disclosure.
Figure 7B:
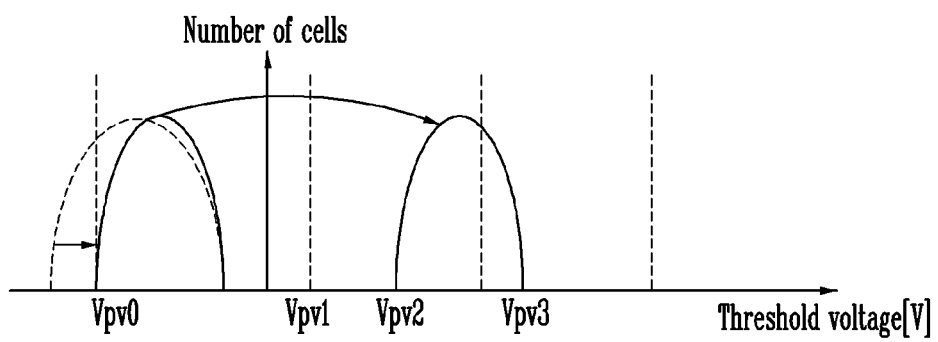
Figure 7C:
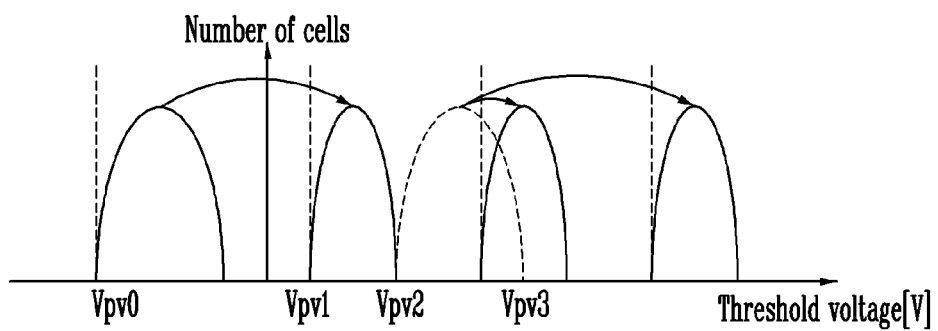

FIG. 6 is a flowchart illustrating a method of operating the semiconductor memory device according to an exemplary embodiment of this disclosure. FIGS. 7A to 7C show waveforms illustrating threshold voltages shifted according to the method of operating the semiconductor memory device according to an exemplary embodiment of this disclosure.

Referring to FIGS. 1, 2, 6, and 7A, an LSB program loop for storing the LSB data of 2-bit data in one memory cell is performed at step S601. The LSB program loop may be performed according to the same method as that performed in the LSB program loop described at step S301 of FIG. 3.

Referring to FIGS. 1, 2, 6, and 7B, it is determined whether there are memory cells in the erase state at step S603. If, as a result of the check, memory cells remained in the erase state are determined to exist, a subprogram loop is performed on the memory cells in the erase state at step S605. The steps S603 and S605 may be performed according to the same method as those described at steps S301, S303, and S305 of FIG. 3.

Referring to FIGS. 1, 2, 6, and 7C, at step S607, an MSB program loop for storing MSB data of 2-bit data in a memory cell is performed. The MSB program loop includes an MSB program operation and an MSB program verification operation. For the MSB program operation, the voltage supply circuit (e.g., 130 and 140) supplies the program voltage Vpgm to the memory cells of a selected page. Furthermore, the page buffer group 150 supplies a program prohibition voltage (for example, a power supply voltage) to bit lines coupled to memory cells in which erase data (for example, '1') is to be stored as the MSB data and supplies a program permission voltage (for example, a ground voltage) to bit lines coupled to memory cells in which program data (for example, '0') is to be stored as the MSB data.

Accordingly, the memory cells have four different threshold voltage distributions according to a level of the LSB data stored through the LSB program loop and a level of the MSB data stored through the MSB program operation.

Here, in the MSB program verification operation, if memory cells having threshold voltages not reached each of target levels PV1 to PV3 are detected, the program voltage is raised. The MSB program operation is further performed by supplying the raised program voltage Vpgm to the memory cells. Next, the MSB program verification operation is performed again.

Before the MSB program loop is performed, a subprogram loop may be performed so that the width of a threshold voltage distribution of the memory cells in the erase state become narrow. Therefore, by performing the subprogram loop, an increment of the threshold voltage in the MSB program loop can be reduced, and thus a program interference phenomenon occurring in the MSB program loop can be reduced.

Figure 8:
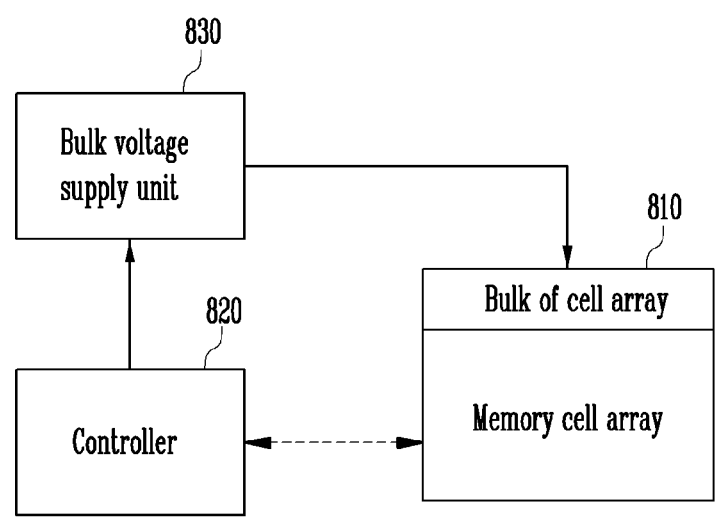
FIG. 8 is a circuit diagram of a semiconductor memory device according to an exemplary embodiment of this disclosure.

FIG. 8 is a circuit diagram of a semiconductor memory device according to an exemplary embodiment of this disclosure.

Referring to FIG. 8, the semiconductor memory device includes a memory cell array 810, a controller 820 configured to control a subprogram loop for raising memory cells of an erase state, having threshold voltages lower than a target voltage of a negative potential, to be higher than the target voltage, and a bulk voltage supply unit 830 configure to supply a bulk voltage of a positive potential corresponding to an absolute value of the target voltage of the negative potential to a bulk of the memory cell array a bulk voltage supply unit configure to supply a bulk voltage of a positive potential corresponding to an absolute value of the target voltage of the negative potential to a bulk of the memory cell array.

As described above, according to the exemplary embodiment of this disclosure, the width of the threshold voltage distribution of the erase state become narrow by raising threshold voltages of memory cells having low threshold levels among all the memory cells in the erase state. Accordingly, an interference phenomenon occurring when the memory cells are programmed, and thus a program operation characteristic can be improved.

What is claimed is:

1. A method of operating a semiconductor memory device, comprising:
    performing a first program loop including a first program operation and a first program verification operation in order to store a lower bit data of n-bit data in memory cells;
    performing a subprogram loop for memory cells of an erase state, having threshold voltages lower than a target voltage of a negative potential, so that the threshold voltages of the memory cells of the erase state become higher than the target voltage; and
    performing a second program loop including a second program operation and a second verification operation in order to store an upper bit data of the n-bit data in the memory cells.

2. The method of claim 1, wherein the first program loop is the least significant bit (LSB) program loop and the second program loop is a central significant bit (CSB) program loop of a 3-bit data programming.

3. The method of claim 2, wherein after the CSB program loop is completed, the subprogram loop is further performed before the most significant bit (MSB) program loop is performed.

4. The method of claim 1, further comprising a checking operation whether there are memory cells of the erase state using data of page buffers, after the first program loop is completed.

5. The method of claim 4, wherein if, as a result of the checking operation, memory cells of the erase state do not exist, the subprogram loop is not performed.

6. The method of claim 1, wherein the subprogram loop is further performed before the first program loop is performed.

7. The method of claim 1, wherein the subprogram loop comprises:
    performing a subverification operation for detecting the memory cells having the threshold voltages lower than the target voltage; and
    performing a subprogram operation for supplying a subprogram voltage to the memory cells, detected in the subverification operation, in order to raise the threshold voltages of the memory cells having the threshold voltages lower than the target voltage.

8. The method of claim 7, wherein the subverification operation is performed by supplying a ground voltage to the memory cells and a well bias of a positive potential, corresponding to an absolute value of the negative potential, to a bulk of the memory cells.

9. The method of claim 8, wherein a bit line voltage, supplied to bit lines electrically coupled to drains of the memory cells, and a source voltage, supplied to a source line electrically coupled to sources of the memory cells, are raised by a potential of the well bias and supplied.

10. A method of operating a semiconductor memory device, comprising:
    performing a LSB program loop in order to store LSB data of n-bit data in memory cells; and
    performing a subprogram loop for memory cells of an erase state, having threshold voltages lower than a target voltage of a negative potential, so that the threshold voltages of the memory cells of the erase state become higher than the target voltage.

11. The method of claim 10, further comprising checking operation whether there are memory cells of the erase state using data of page buffers, after the LSB program loop is completed.

12. The method of claim 11, wherein if, as a result of the checking operation, memory cells of the erase state do not exist, the subprogram loop is not performed.

13. The method of claim 10, wherein the subprogram loop is further performed before the LSB program loop is performed.

14. The method of claim 10, wherein after the LSB program loop is completed, the subprogram loop is further performed.

15. The method of claim 10, wherein the subprogram loop comprises:
    performing a subverification operation for detecting the memory cells having the threshold voltages lower than the target voltage; and
    performing a subprogram operation for supplying a subprogram voltage to the memory cells, detected in the subverification operation, in order to raise the threshold voltages of the memory cells having the threshold voltages lower than the target voltage.

16. The method of claim 15, wherein the subverification operation is performed by supplying a ground voltage to the memory cells and a well bias of a positive potential, corresponding to an absolute value of the negative potential, to a bulk of the memory cells.

17. The method of claim 16, wherein a bit line voltage, supplied to bit lines electrically coupled to drains of the memory cells, and a source voltage, supplied to a source line electrically coupled to sources of the memory cells, are raised by a potential of the well bias and supplied.

18. A semiconductor memory device, comprising:
    a memory cell array;
    a controller configured to control a subprogram loop for raising memory cells of an erase state, having threshold voltages lower than a target voltage of a negative potential, to be higher than the target voltage; and
    a bulk voltage supply unit configure to supply a bulk voltage of a positive potential corresponding to an absolute value of the target voltage of the negative potential to a bulk of the memory cell array.

19. The semiconductor memory device of claim 18, wherein the controller checks whether the memory cells of the erase state exist before the subprogram loop is performed.

20. The semiconductor memory device of claim 19, wherein if, as a result of the check, the memory cells of the erase state do not exist, the subprogram loop is not performed.

21. The semiconductor memory device of claim 18, wherein when the subprogram loop is performed, a ground voltage is applied to the memory cells and a well bias of a positive potential, corresponding to an absolute value of the target voltage, is applied to a bulk of the memory cells.

22. The semiconductor memory device of claim 21, wherein a bit line voltage, supplied to bit lines electrically coupled to drains of the memory cells, and a source voltage, supplied to a source line electrically coupled to sources of the memory cells, increase by a potential of the well bias.

* * * * *